US009482818B2

(12) United States Patent
Kachru et al.

(10) Patent No.: US 9,482,818 B2
(45) Date of Patent: Nov. 1, 2016

(54) OPTICALLY COUPLING WAVEGUIDES

(71) Applicant: Cisco Technology, Inc., San Jose, CA (US)

(72) Inventors: Ravinder Kachru, San Jose, CA (US); Pang-Chen Sun, San Diego, CA (US); Chris Kiyoshi Togami, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 55 days.

(21) Appl. No.: 14/629,182

(22) Filed: Feb. 23, 2015

(65) Prior Publication Data

US 2016/0246004 A1    Aug. 25, 2016

(51) Int. Cl.
| | |
|---|---|
| *G02B 6/12* | (2006.01) |
| *G02B 6/13* | (2006.01) |
| *G02B 6/30* | (2006.01) |
| *G02B 6/32* | (2006.01) |
| *G02B 6/26* | (2006.01) |
| *G02B 6/42* | (2006.01) |
| *G02F 1/39* | (2006.01) |
| *H01S 5/02* | (2006.01) |
| *G02F 1/09* | (2006.01) |

(52) U.S. Cl.
CPC .............. *G02B 6/26* (2013.01); *G02B 6/4214* (2013.01); *G02F 1/093* (2013.01); *G02F 1/39* (2013.01); *H01S 5/0208* (2013.01)

(58) Field of Classification Search
CPC .......... G02B 6/36; G02B 6/30; G02B 6/305; G02B 6/428; G02B 6/4204; G02B 6/4214; G02B 6/4218; H01S 5/0208; G02F 1/39; G02F 1/093; G02F 1/395
USPC ............... 385/14–24, 33–39; 250/214.1, 227
See application file for complete search history.

(56) References Cited

U.S. PATENT DOCUMENTS

| | | | |
|---|---|---|---|
| 6,254,280 B1 | 7/2001 | Hubbauer et al. | |
| 8,213,751 B1 * | 7/2012 | Ho | G02B 6/305 385/1 |
| 8,270,783 B2 * | 9/2012 | Foster | G02F 1/39 359/333 |
| 8,340,483 B2 * | 12/2012 | Lee | G02B 6/4204 385/14 |
| 8,938,142 B2 * | 1/2015 | Shastri | G02B 6/305 385/31 |
| 2006/0215963 A1 * | 9/2006 | Hamano | G02B 6/30 385/49 |

(Continued)

FOREIGN PATENT DOCUMENTS

| | | |
|---|---|---|
| EP | 1308760 A1 | 5/2003 |
| WO | 0026707 | 5/2000 |

*Primary Examiner* — Akm Enayet Ullah
(74) *Attorney, Agent, or Firm* — Patterson + Sheridan, LLP

(57) ABSTRACT

Embodiments disclosed herein generally relate to an optical device for transferring light between a first and second waveguide. The optical device may generally include the first waveguide, a first support member and a base on which the first waveguide and first support member are disposed. The optical device may further include a second support member wherein the first support member is disposed between the second support member and the base. The second support member comprises at least one groove. The second waveguide may be disposed at least partially in the groove such that the second waveguide is between the first and second support members. The optical device may further include at least one lens disposed between the first waveguide and the second waveguide to transfer an optical signal between the first and second waveguides through the lens.

20 Claims, 5 Drawing Sheets

(56) References Cited

U.S. PATENT DOCUMENTS

| | | | |
|---|---|---|---|
| 2006/0239612 A1* | 10/2006 | De Dobbelaere | G02B 6/4214 385/37 |
| 2009/0154872 A1* | 6/2009 | Sherrer | G02B 6/4248 385/14 |
| 2013/0209026 A1* | 8/2013 | Doany | G02B 6/4214 385/14 |
| 2014/0144009 A1 | 5/2014 | Chattopadhyay et al. | |
| 2014/0177995 A1* | 6/2014 | Mohammed | G02B 6/36 385/14 |
| 2014/0203175 A1* | 7/2014 | Kobrinsky | G02B 6/428 250/214.1 |
| 2015/0063745 A1* | 3/2015 | Lin | H01S 5/0208 385/14 |
| 2015/0185426 A1* | 7/2015 | Miao | G02F 1/093 385/33 |
| 2015/0261058 A1* | 9/2015 | Silverstone | G02F 1/395 385/3 |

* cited by examiner

OPTICALLY COUPLING WAVEGUIDES

TECHNICAL FIELD

Embodiments presented herein generally relate to waveguides in an optical device, and more specifically, to transferring an optical signal between a waveguide in a photonic chip to an optical fiber.

BACKGROUND

Silicon-on-Insulator (SOI) optical devices may include an active surface layer that includes waveguides, optical modulators, detectors, CMOS circuitry, metal leads for interfacing with external semiconductor chips, and the like. Transmitting optical signals from and to this active surface layer introduces many challenges. For example, a fiber optic cable may be attached to the SOI optical device and interface with a waveguide on its surface layer. The mode field diameter of the one or more modes of the optical cable may be approximately 10 microns for a single mode cable.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
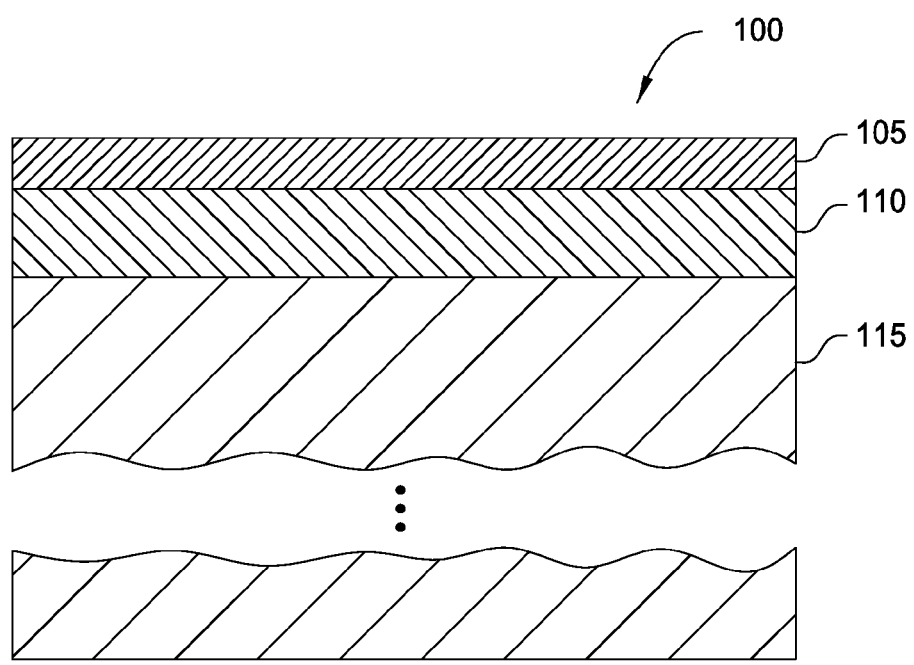
FIG. 1 generally illustrates a SOI device, according to one embodiment disclosed herein.

One embodiment presented in this disclosure is an optical device for transferring light between a silicon waveguide and an optical waveguide. The optical device may generally include the silicon waveguide, a first support member, and a base on which the silicon waveguide and first support member are disposed. Respective positions of the silicon waveguide and the first support member may be fixed relative to the base. The optical device may include a second support member, where the first support member is disposed between the second support member and the base. The second support member defines a feature, such as a groove, sized and shaped to accommodate the optical waveguide at least partially therein, such that the optical waveguide is at least partially between the first and second support members. The optical device may further include a lens disposed between the silicon waveguide and the optical waveguide to transfer an optical signal between the silicon waveguide and the optical waveguide.

Another embodiment presented herein is a method for transferring light between a silicon waveguide and an optical waveguide. The method may generally include disposing a first support member and the silicon waveguide on a base, wherein respective positions of the first support member and the silicon waveguide are fixed relative to the base; disposing an optical waveguide in a feature, such as a groove, in a second support member, wherein the first support member is between the second support member and the base, and wherein the optical waveguide is at least partially between the first and second support members; disposing a lens between the silicon waveguide and the optical waveguide; and aligning the lens to transfer the optical signal between the silicon waveguide and the optical waveguide through the lens.

Another embodiment presented herein is an optical device having a first waveguide, a first support member, and a base on which the first waveguide and first support member are disposed. Respective positions of the silicon waveguide and the first support member may be fixed relative to the base. The optical device may further comprise a second support member, wherein the first support member is disposed between the second support member and the base. The second support member may comprise an inset. The optical device may have a second waveguide disposed at least partially in the inset such that the second waveguide is between the first and second support members. The optical device may further include a lens disposed between the first waveguide and the second waveguide to transfer an optical signal between the first and second waveguides through the lens.

EXAMPLE EMBODIMENTS

There is considerable interest in finding solutions for efficient high speed data transport between waveguides in optical networks. For example, coupling optical signals emanating from guided wave arrays such as Lasers, waveguides, light emitting diodes (LEDs) or other arrays into an array of single-mode optical fibers is often used for high density parallel data transport. While multi-mode fibers may be limited to a length of several hundred meters, single mode fibers can transport high speed data beyond this limit. However, using a single mode fiber introduces certain challenges. For example, tolerances specified to align an optical signal to and from a single mode fiber may be tighter than tolerances for a multi-mode fiber.

Some data communication networks that rely on high speed and high channel throughput of optical interconnections use silicon integrated circuit technology to assist in high bandwidth optical signal modulation, switching/routing, as well as signal detection. The footprints of silicon photonic devices are typically smaller and provide a higher channel count within a single integrated device as compared to other types of photonic devices. This small footprint imposes additional challenges for efficiently transferring an optical signal between a silicon waveguide in a photonic device and a larger waveguide such as fiber optic cable. For example, the relative core versus cladding refractive index difference increases as silicon waveguides shrink in size. This may result in greater mismatch in the optical mode sizes between a silicon waveguide and an optical fiber. For example, the mode field diameter of the one or more modes of the optic cable (e.g., approximately 10 microns for a single-mode cable) may have a much different size than the mode of a sub-micron dimensioned waveguide tasked with routing the optical signal in the SOI device. Accordingly, directly interfacing the fiber optic cable with the sub-micron waveguide may result in low transmission efficiency or high coupling loss (e.g., less than 1% coupling efficiency). To mitigate this issue, some solutions place waveguide mode converters near the interface between the silicon waveguide and fiber channel in an attempt to achieve a low-loss, adiabatic transition between the two waveguides. However, these approaches may use sophisticated and costly semiconductor processing.

Therefore, what is needed are cost effective and efficient techniques for transferring an optical signal between a silicon waveguide and fiber optic cables. Certain aspects of the present embodiment provide an optical device which may generally include a base on which at least one first waveguide (e.g., a silicon waveguide) may be coupled. A first support member may also be coupled to the base such that respective positions of the silicon waveguide and the first support member are fixed relative to each other and to the base. In certain embodiments, the optical device may include a second support member having at least one feature, such as a groove, for securing a fiber array (e.g., a single mode fiber array) and disposed above the first support member. An array of lenses may be disposed between a set of silicon waveguides and the fiber array to direct an optical signal between the silicon waveguides and the fiber array.

FIG. 1 generally illustrates a (silicon-on-insulator) SOI device 100 comprising a silicon waveguide, according to one embodiment disclosed herein. SOI device 100 includes a surface layer 105, a buried insulation layer 110 (also referred to as buried oxide (BOX) layer), and a semiconductor substrate 115. Although the surface layer 105 and substrate 115 may comprise silicon, the disclosure is not limited to such material. For example, other semiconductors or optically transmissive materials may be used to form the structure 100 shown here. Moreover, the surface 105 and substrate 115 may be made of the same material or can be made from different materials.

The thickness of the surface layer 105 may range from less than 100 nanometers to greater than a micron. More specifically, the surface layer 105 may be between 100-300 nanometers thick. The thickness of the insulation layer 110 may vary depending on the desired application. In one embodiment, the thickness of insulation layer 110 may range from less than one micron to tens of microns. The thickness of the substrate 115 may vary widely depending on the specific application of the SOI device 100. For example, the substrate 115 may be the thickness of a typical semiconductor wafer (e.g., 100-700 microns) or may be thinned and/or mounted on another substrate.

For optical applications, the silicon surface layer 105 and insulation layer 110 (e.g., silicon dioxide, silicon oxynitride, and the like) may provide contrasting refractive indexes that confine an optical signal in a silicon waveguide in the surface layer 105. The surface layer 105 of the SOI device 100 may be etched or patterned to form one or more silicon waveguides (e.g., silicon waveguide 204 of FIG. 2). Because silicon has a higher refractive index compared to an insulator such as silicon dioxide, the optical signal remains primarily in the waveguide as it propagates across the surface layer 105.

Figure 2:
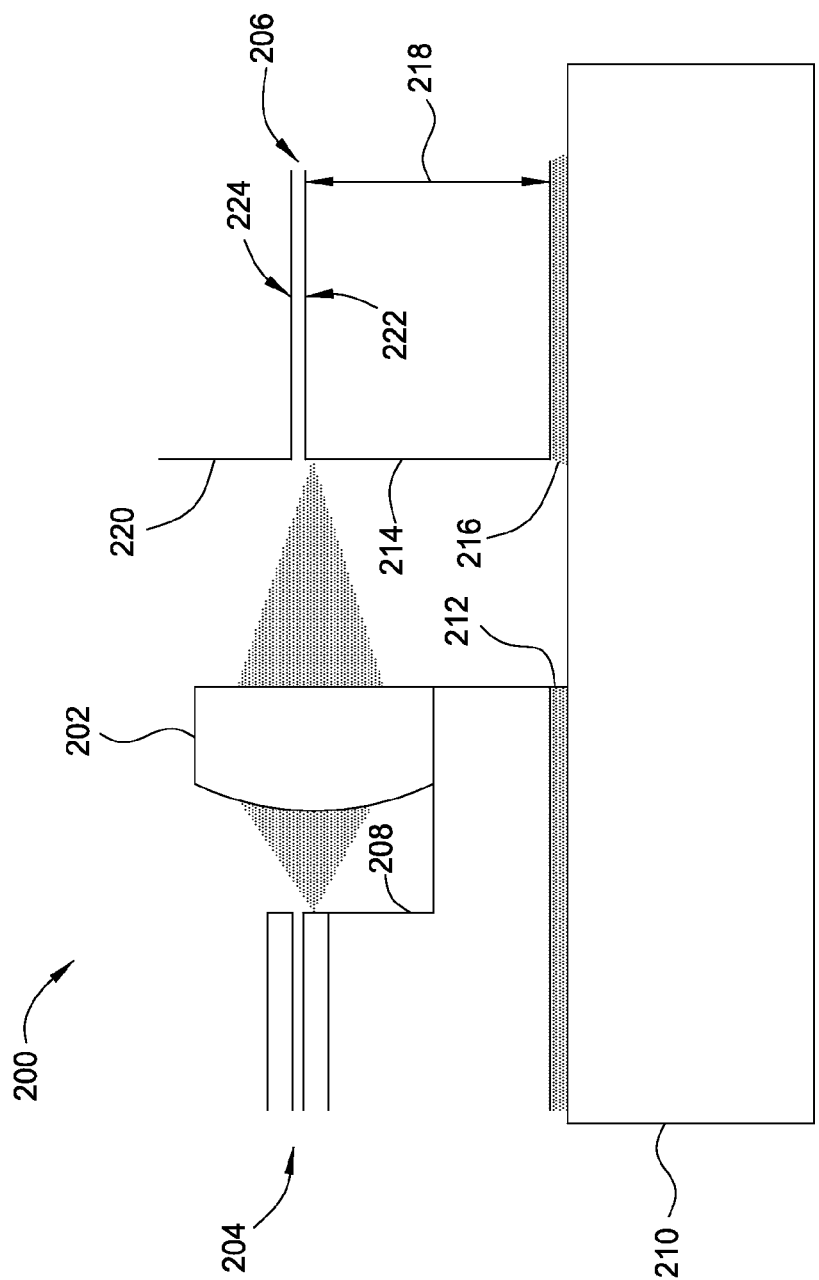
FIG. 2 illustrates an optical device having a single lens array for transferring light between a first and second waveguide, according to one embodiment disclosed herein.

FIG. 2 illustrates an optical device 200 for transferring an optical signal using at least one lens 202 disposed between at least one first waveguide and at least one second waveguide. The first and second waveguides may be any type of waveguides having different mode sizes. For example, the first waveguide may be a silicon waveguide 204 and the second waveguide may be an optical fiber 206. The surfaces of the lens 202 may be designed to match a mode diameter between the silicon waveguide 204 and the optic fiber 206. For example, each of waveguides 204 and 206 may have a different numerical aperture (i.e., the range of angles over which the waveguide can accept or emit an optical signal or light). Therefore, differences in the angle over which a first wave guide (e.g., silicon waveguide 204) can emit light and a second waveguide (e.g., optical fiber 206) can accept light may be accounted for by the lens 202. For example, the lens 202 may be designed to direct light towards a core of the optical fiber 206 at an angle that the optical fiber 206 can accept.

A silicon photonic integrated circuit 208, such as the SOI device 100 of FIG. 1, includes the silicon waveguide 204. In the embodiment shown, the silicon photonic integrated circuit 208 (i.e., a photonic chip) is coupled to a base 210 which serves as an optical bench. In this example, the silicon photonic integrated circuit 208 is coupled to the base 210 using a first adhesive material 212, such as an epoxy. A first support member 214 is also coupled to the base 210 using a second adhesive material 216. The second adhesive material 216 may be the same as or different than the first adhesive material 212.

Figure 3:
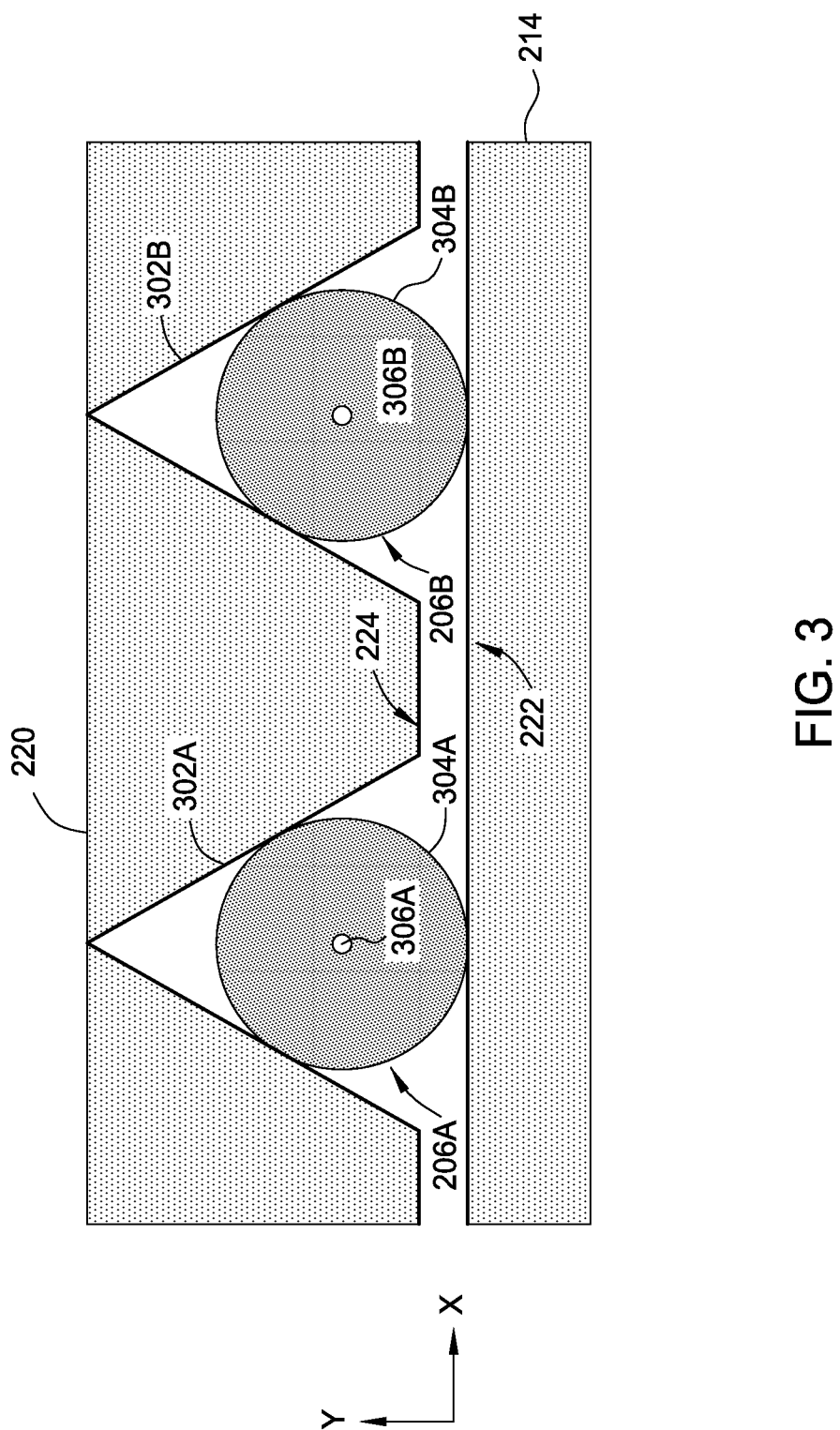
FIG. 3 illustrates a support member having grooves to provide support for an array of fiber optic cables, according to one embodiment disclosed herein.

A second support member 220 is disposed, at least in part, proximate the first support member 214. In the example shown in FIG. 2, the second support member 220 is disposed above the first support member 214. However, it will be understood that terms of orientation used throughout this disclosure such as above, below, over, under etc. are relative, and not absolute. The optic fiber 206 is at least partially disposed between the first support member 214 and the second support member 220 such that support members 214 and 220 provide support for the optical fiber 206, as will be discussed in more detail with respect to FIG. 3. As illustrated in FIG. 3, the height of the optical fiber 206 above the base 210 and relative to the silicon waveguide 204 is determined by the thickness 218 of the first support member 214. Using the thickness 218 of first support member to fix the height of the optical fiber 206 provides an advantage of improved tolerance when aligning the waveguides 204, 206. By coupling the silicon photonic integrated circuit 208 and the first support member 214 to the base 210, a fixed distance between the silicon waveguide 204 and the fiber array 206 is established.

In one embodiment, the photonic chip 208 includes a set (or array) of silicon waveguides 204 that extends into the page of FIG. 2. In such an example, the lens 202 may be part of a larger lens array where each lens in the array corresponds to one of the silicon waveguides 204. In addition, an array of optic fibers (of which optic fiber 206 is a part) also extends in the same direction as the set of silicon waveguides 204 and is between the first and second support members 214, 220. As described above, each lens may be used to optically couple a respective one of the silicon waveguides 204 to a respective one of the optic fibers 206 in the array.

Although FIG. 2 illustrates aligning silicon waveguide 204 to optic fiber 206, embodiments of the present disclosure may be used to align any types of waveguides having different mode sizes. In certain embodiments, the first waveguide (e.g., the silicon waveguide 204) may be any other type of waveguide such as a waveguide using a different type of semiconductor or optic fiber with a different mode size than optic fiber 206. In certain embodiments, the thickness of the silicon waveguide 204 may be less than one micron. The second waveguide (e.g., optical fiber 206) may also comprise other types of waveguides. In certain embodiments, the first or second waveguide may be a laser such that an optical signal from the laser can be coupled with a waveguide in a similar manner as presented herein.

In certain embodiments, the lens 202 is made from silicon. A silicon lens may be able to bend light at a greater angle as compared to other types of lenses (e.g., a glass lens). Therefore, with greater light bending capability, an optical signal may be focused within a smaller distance between the waveguides 204 and 206. As a result, the optical device 200 may be manufactured within a smaller area. For example, with a silicon lens, the distance from the silicon waveguide 204 and the optical fiber 206 may be approximately 1 mm (e.g., between 0.7 mm to 1.3 mm), as opposed to approximately 5 mm (e.g., between 4 mm and 6 mm) using a different type of lens (e.g., glass lens). In certain embodiments, if the lens 202 comprises silicon, a distance between the silicon waveguide 204 and the lens 202 may be in the range of 10 micrometers to 10 mm and the distance between the lens 202 and optical fiber 206 may be in the range of 10 micrometers to 10 mm.

In addition to including the silicon waveguide 204, the photonic chip 208 may include various other optical or electrical components. For example, photonic chip 208 may include an optical modulator formed by performing various fabrication steps on the silicon layer 105 shown in FIG. 1 such as etching or doping the silicon material as well as depositing additional materials into or onto the layer 105. Conductive leads may be used to transmit a data signal that controls the optical modulator. In one embodiment, the optical modulator is a CMOS capacitor including n-type and p-type doped regions coupled to respective conductive leads for changing the phase of the optical signal passing through the modulator. The conductive leads may be connected to an electrical integrated circuit mounted on the photonic chip 208 that provides one or more data signals that control the modulator. In one example, the silicon waveguide 204 may be coupled to an output of the optical modulator and used in the photonic chip 208 to transmit a modulated optical signal to the optic fiber 206 using the arrangement of optical device 200.

FIG. 3 provides a view of the optical device 200 shown in FIG. 2 from the perspective of an array of lenses facing an array of optical fibers. That is, FIG. 3 illustrates an embodiment where the optical device 200 includes an array of lenses that optically couple a set of silicon waveguides to the array of optical fibers. To assist in understanding the orientation of the optical device 200, x and y axes are shown. A z-axis (not shown) extends into and out of the page. The optical device 200 shown in FIG. 3 shows the first support member 214 and second support member 220 in a stacked arrangement along the y-axis, with a plurality of fibers 206 (two shown) sandwiched therebetween. The fibers 206 each have a core 306A and 306B that is surrounded by a cladding material 304A and 304B. In the illustrated embodiment, any coating, strength member or insulative jacket associated with the optical fibers 206 has been removed from the portion of the fibers 206 that are placed between the first and second support members, 214, 220. The fibers 206 are fixed in place by provisioning the support members with respective surface features/characteristics. The second support member 220 includes surface features 302A and 302B (e.g., an inset or depression) formed on a bottom surface 224 of the second support member 220 and extending at least partially in the z direction through the second support member 220. In the illustrative case, the features 302A and 302B are V-shaped grooves. The V-shape may facilitate placement of the fibers into the grooves 302A and 302B. Specifically, the relatively wider opening of the grooves at the surface level facilitates initially registering the fibers with the grooves. As the fibers are forced deeper into the grooves, the inward tapering sidewalls of the grooves urge the fibers 206 into a desired position relative to adjacent fibers. Grooves 302A and 302B may be configured such that the fibers at least partially protrude from the grooves in the y direction in order for the fibers to make contact with the top side 222 of the first support member 214. In a particular example, a distance between the cores 306A-B of adjacent optic fibers (i.e., the pitch) in the array may range from 0.1 mm to 0.5 mm. While V-shaped grooves are shown, in other embodiments, the grooves may be U-shaped or any other shape suitable for fixing the position of the optic fibers. In some cases, the shape of the grooves may provide some mechanical constraint of the fibers disposed therein, such as where the grooves are press fitted. However, in some embodiments, it may be desirable to secure the fibers in the grooves with adhesive.

The bottom surface 224 of the second support member, and thus the grooves themselves 302A and 302B, are in a facing relationship with a top side 222 of the first support member 214. The top side 222 is a substantially planar surface. That is, in at least one embodiment, the top side 222 does not include any depressions or grooves adapted to receive the optic fibers 206. Instead, as shown in FIG. 3, the bottommost portion of the optic fibers 206 contact the top side 222 which lies along a plane. Moreover, the top side 222 may be parallel with a bottom surface (not shown) of the first support member which interfaces with the base such that the elevation of the bottommost portions of the fibers 206 to the base in a direction perpendicular to the top side 222 is approximately equal. The collective arrangement of the grooves formed in the second support member 220 and the substantially planar top side 222 disposed parallel to the bottom surface of the first support member may, in some cases, improve the tolerance in controlling a height of the optical fibers 206 from the base 210. Although an optical fiber is shown, the present embodiments can be used in other optical arrangements such as interfacing the silicon waveguide to another semiconductor waveguide which may have the same mode field dimensions or a different mode field dimensions.

Returning to FIG. 2, by resting the optical fibers 206 on the top side 222 of the first support member 214 which defines a single plane, the thickness 218 (i.e., height) of the first support member 214 establishes a height of the fiber array 206 above the base 210. Therefore, the ability to control the thickness of the first support member 214 determines whether the optical device achieves the tolerance requirements for controlling the height of the optical fibers 206. Advantageously, the first support member 214 (without grooves) may be manufactured with better thickness tolerance than a support member with grooves. Therefore, the height of the fiber array 206 of the optical device 200 may be controlled with greater accuracy over optical devices having a support member with grooves at the bottom (i.e., in the first support member 214). The first support member 214 may include materials such as pyrex glass, silicon, or other semiconductors and, in certain embodiments, have a thickness tolerance of ±5 microns.

Moreover, the thickness 218 of the first support member 214 may be selected or manufactured in an attempt to closely match the height, above the base 210, of the core 306 of the optical fiber 206 and the center of the silicon waveguide 204. With the waveguides 204 and 206 substantially aligned (e.g., within a predefined tolerance), an optical signal being transferred between the waveguides 204 and 206 passes through the lens 202 disposed between the waveguides 204, 206. As shown, the lens 202 is disposed, at least in part, above the photonic chip 208 such that a portion of the silicon photonic chip 208 is between the lens 202 and the base 210. In one embodiment, the lens 202 is coupled to the photonic chip 208 using a third adhesive material. The third adhesive material may be the same, or different than the first and second adhesive materials 212 and 216.

In certain embodiments, the first support member 214 is made from a material having a thermal expansion coefficient that substantially matches a thermal expansion coefficient of the silicon-photonic integrated circuit 208. By matching the thermal expansion coefficients of the first support member 214 that supports the fiber array 206, and the silicon-photonic integrated circuit 208 having the silicon waveguide 204, a reduction in coupling efficiency of an optical signal between the waveguides 204 and 206 as result of changes in temperature may be avoided. With matching thermal expansion coefficients, any change in position of the silicon waveguide 204 caused by a change in temperature (e.g., temperature of the optical device) may also be experienced in the same manner by the optic fiber 206, therefore, maintaining alignment between waveguides 204 and 206. Non-limiting examples of embodiments where the thermal expansion coefficients for the photonic chip 208 and the first support member 214 match include forming the photonic chip 208 and the first support member 214 from the same material (e.g., silicon) or forming the photonic chip 208 primarily from silicon (or silicon dioxide) and the first supporting member 214 from a glass material such as pyrex glass.

Disposing the lens 202 between the waveguides 204 and 206 may provide several advantages. For example, the lens 202 may be used to match an optical mode between the silicon waveguide 204 and the optical fiber 206. Moreover, the position and angle of the lens may be adjusted to align (e.g., fine tune the alignment) of light (e.g., optical signal) being transferred between the waveguides 204 and 206. For example, the position and angle of the lens 202 may be actively aligned such that an optical signal transmitted by silicon waveguide is received by the core 306 of the optic fiber 206, and vice versa.

Figure 4:
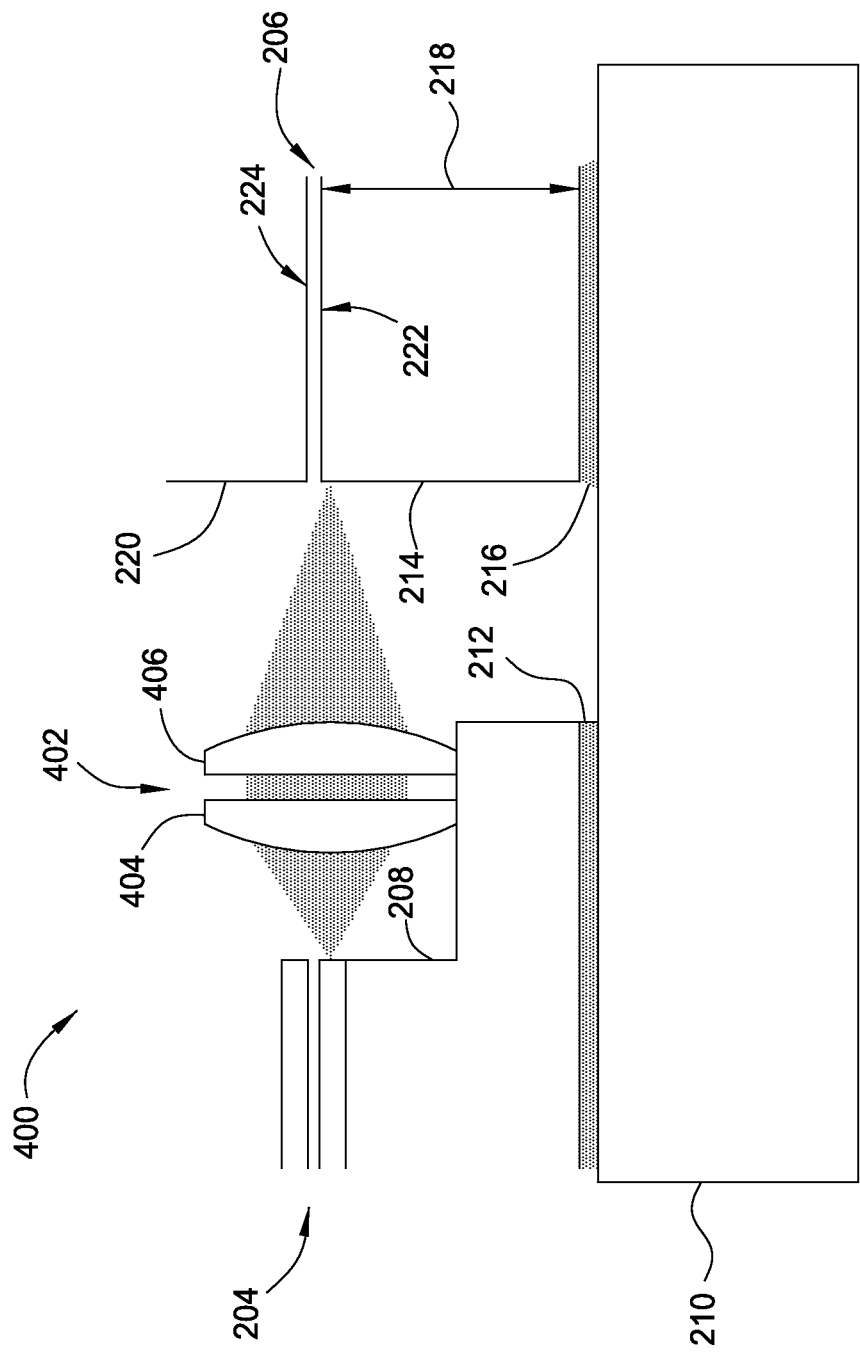
FIG. 4 illustrate the optical device of FIG. 2 having a dual lens array, according to embodiments disclosed herein.

As illustrated in FIG. 4, the optical device 400 includes a dual lens array 402 having a first lens 404 and a second lens 406. The first lens 404 may be aligned to collimate an optical signal (i.e., light) received from the silicon waveguide 204 which is transferred to the second lens 406. The second lens 406 may then de-collimate the optical signal such that the optical signal is focused or directed towards the core of the optic fiber 206. In certain embodiments, an optical signal may be transferred from the optical fiber 206 to the silicon waveguide 204 in a similar manner.

Furthermore, in one embodiment, the photonic chip 208 includes a set (or array) of silicon waveguides 204 that extends into the page of FIG. 4. In such an example, the dual lens array 402 may be part of a larger lens array where each lens pair in the array corresponds to one of the silicon waveguides 204. In addition, an array of optic fibers (of which optic fiber 206 is a part) also extends in the same direction as the set of silicon waveguides 204 and is disposed between the first and second support members 214, 220. As described above, each of the lens pairs may be used to optically couple a respective one of the silicon waveguides 204 to a respective one of the optic fibers 206 in the array.

Figure 5:
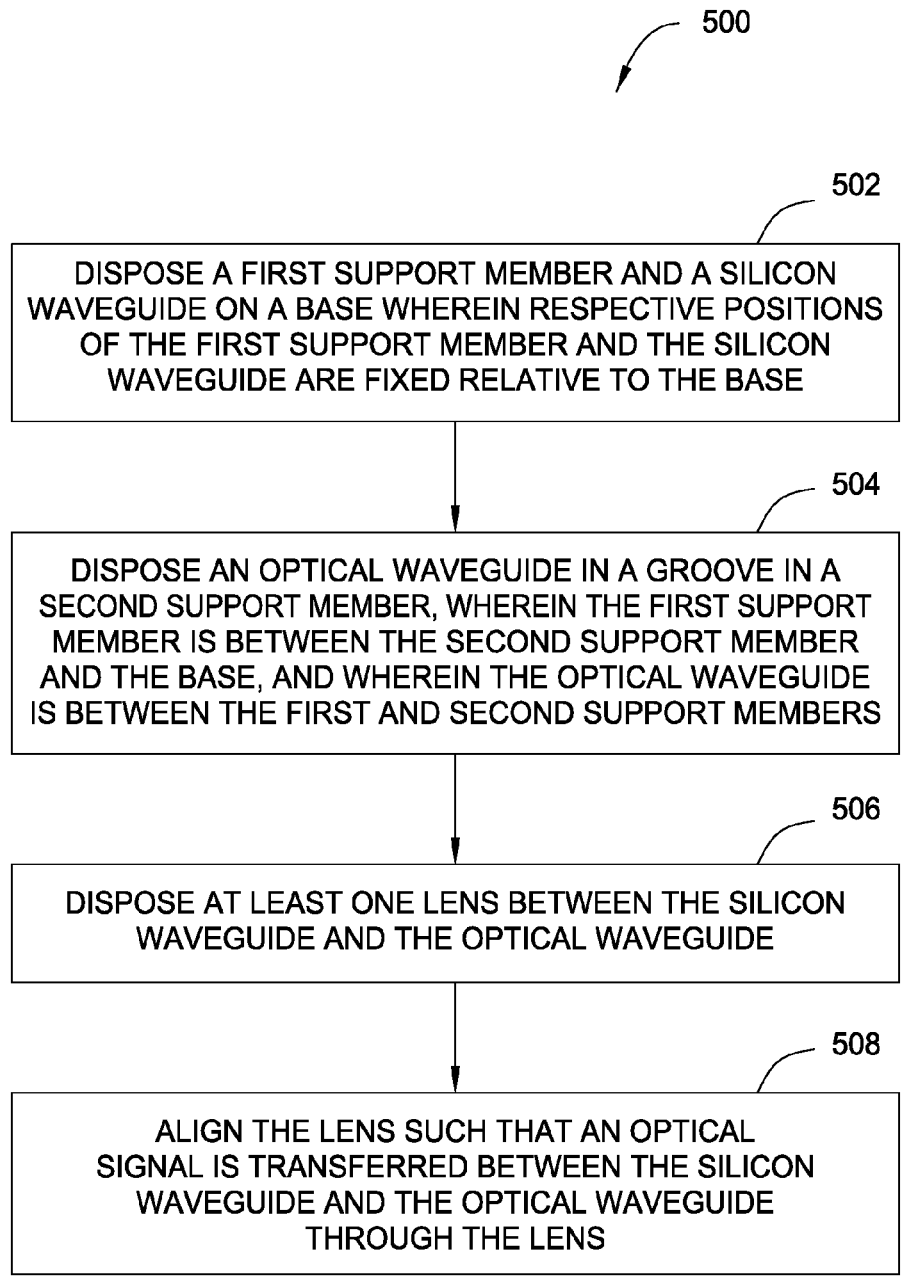
FIG. 5 illustrates a technique for manufacturing an optical device that transfers an optical signal between a first and second waveguide, according to one embodiment disclosed herein.

FIG. 5 illustrates a method 500 for manufacturing an optical device, in accordance with aspects of the present disclosure. The method 500 may be performed, for example, by a manufacturer, such as a semiconductor manufacturer.

The method 500 begins at block 502 by disposing a first support member and a silicon waveguide on a base such that respective positions of the silicon waveguide and the first support member are fixed relative to the base. At block 504, the manufacturer may dispose an optic fiber in a groove in a second support member, where the first support member is between the second support member and the base and where the optic fiber is between the first and second support members. In one embodiment, the base sets a distance between the silicon waveguide and the optic fiber coupled to the first support member. Although the embodiments herein describe fixing the distance between the photonic chip and the first support member using an adhesive material, in other embodiments, the distance may be fixed using a pluggable connection. For example, the photonic chip on which the silicon waveguide is disposed or the first support member may be removably attached to the base using a connector. By virtue of coupling the photonic chip or the first support member to the base, the desired alignment between the silicon waveguide and the optical fiber may be achieved (within predefined tolerances).

In one embodiment, the manufacturer disposes the first support member onto the second support member to form a unit where the optic fiber (or fibers) is disposed between the first and second support members. In a subsequent processing step, the manufacturer inverts the unit such that the second support member is disposed above the first support member relative to the base. That is, the first support member is coupled to the base such that the first support member is between the base and the second support member as shown in FIGS. 2 and 4. Alternatively, the manufacture may first couple the first support member to the base before subsequently coupling the second support member to the first support member such that the optic fiber is disposed between the support members.

In one embodiment, the manufacturer applies an adhesive material to the groove in the second support member after disposing the optic fiber in the groove. Moreover, the adhesive material may be applied either before the second support member is coupled to the first support member or after the first and second support members have been physically coupled.

At block 506, the manufacturer disposes at least one lens (e.g., single lens array 202 shown in FIG. 2 or dual lens array 402 shown in FIG. 4) between the silicon waveguide and the first support member. At block 508, the manufacturer may align the lens such that an optical signal is transferred between the silicon waveguide and the optic fiber through the lens.

In certain embodiments, the manufacturer aligns the lens relative to the silicon waveguide and the optic fiber such that an optical signal received by the lens from the silicon waveguide is transmitted to the core of the optic fiber or an optical signal received by the lens from the optic fiber is transmitted to the silicon waveguide.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The flowchart and block diagrams in the Figures illustrate the architecture, functionality and operation of possible implementations of systems or methods. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

In view of the foregoing, the scope of the present disclosure is determined by the claims that follow.

We claim:

1. An optical device, comprising:
   a silicon waveguide;
   a first support member;
   a base on which the silicon waveguide and first support member are disposed wherein respective positions of the silicon waveguide and the first support member are fixed relative to the base;
   a second support member, wherein the first support member is disposed between the second support member and the base, wherein the second support member defines a groove;
   an optical waveguide disposed at least partially in the groove such that the optical waveguide is between the first and second support members; and
   a lens disposed between the silicon waveguide and the optical waveguide to transfer an optical signal between the silicon waveguide and the optical waveguide.

2. The optical device of claim 1, wherein the first support member is coupled to the base using an adhesive material, wherein a thickness of the first support member establishes an alignment between the optical waveguide and the lens in at least one direction.

3. The optical device of claim 1, wherein an opening of the groove faces the base.

4. The optical device of claim 1, wherein a top side of the first support member facing the second support member is a planar surface.

5. The optical device of claim 1, further comprising a silicon-photonic integrated circuit comprising the silicon waveguide wherein the silicon-photonic integrated circuit is disposed at least in part between the lens and the base.

6. The optical device of claim 1, further comprising a silicon-photonic integrated circuit comprising the silicon waveguide wherein the first support member and the silicon-photonic integrated circuit are coupled to the base using a first adhesive material and wherein the lens is coupled to the silicon-photonic integrated circuit using a second adhesive material.

7. The optical device of claim 1, further comprising a silicon-photonic integrated circuit comprising the silicon waveguide wherein the first support member comprises material having a thermal expansion coefficient substantially matching a thermal expansion coefficient of the silicon-photonic integrated circuit.

8. The optical device of claim 1, wherein a thickness of the first support member is based on a distance between the silicon waveguide and the base.

9. The optical device of claim 1, wherein a position and angle of the lens is such that the optical signal from the silicon waveguide is directed toward a core of the optical waveguide.

10. The optical device of claim 1, wherein the lens comprises one of a dual lens array or silicon.

11. The optical device of claim 10, wherein the dual lens array comprises a first lens array and a second lens array, wherein the first lens array is aligned to collimate light received from the silicon waveguide, and wherein the second lens array is aligned to receive the collimated light and send de-collimated light to the optical waveguide.

12. A method, comprising:
    disposing a first support member and a silicon waveguide on a base wherein respective positions of the first support member and the silicon waveguide are fixed relative to the base;
    disposing an optical waveguide in a groove in a second support member, wherein the first support member is between the second support member and the base, and wherein the optical waveguide is between the first and second support members;
    disposing a lens between the silicon waveguide and the optical waveguide; and
    aligning the lens to transfer an optical signal between the silicon waveguide and the optical waveguide through the lens.

13. The method of claim 12, wherein the aligning comprises:
    aligning the lens relative to the silicon waveguide and the optical waveguide such that at least one of:
        a first optical signal received from the silicon waveguide is transmitted to the optical waveguide; and
        a second optical signal received from the optical waveguide is transmitted to the silicon waveguide.

14. The method of claim 13, wherein the aligning the lens comprises:
    controlling at least one of a position or angle of the lens to substantially align a center of the silicon waveguide with a core of the optical waveguide.

15. The method of claim 12, wherein the silicon waveguide is part of a silicon-photonic integrated circuit and wherein the lens is disposed above at least a portion of the silicon-photonic integrated circuit.

16. The method of claim 15, further comprising:
    coupling the first support member to the base using a first adhesive material;
    coupling the silicon-photonic integrated circuit to the base using a second adhesive material; and
    coupling the lens to the silicon-photonic integrated circuit using a third adhesive material.

17. The method of claim 12, further comprising:
    disposing the optical waveguide in the groove on a surface of the second support member;
    disposing the first support member above the second support member to form a unit;

inverting the unit such that the second support member isdisposed above the first support member; and disposing the inverted unit above a base.

18. The method of claim 17, further comprising:

applying an adhesive material to the groove after disposing the optical waveguide in the groove.

19. An optical device, comprising:

a first waveguide;

a first support member;

a base on which the first waveguide and first support member are disposed wherein respective positions of the first waveguide and the first support member are fixed relative to the base;

a second support member, wherein the first support member is disposed between the second support member and the base, wherein the second support member comprises an inset;

a second waveguide disposed at least partially in the inset such that the second waveguide is between the first and second support members; and a lens disposed between the first waveguide and the second waveguide to transfer an optical signal between the first and second waveguides through the lens.

20. The optical device of claim 19, wherein the first waveguide is a semiconductor waveguide and the second waveguide is at least a portion of an optical fiber.

* * * * *